(12) United States Patent
Bohr (10) Patent No.: US 7,109,102 B2
(45) Date of Patent: Sep. 19, 2006

(54) SELF-ALIGNED CONTACTS TO GATES

(75) Inventor: Mark Bohr, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 104 days.

(21) Appl. No.: 10/714,466

(22) Filed: Nov. 14, 2003

(65) Prior Publication Data

US 2004/0229473 A1 Nov. 18, 2004

Related U.S. Application Data

(63) Continuation of application No. 10/226,498, filed on Aug. 22, 2002, now Pat. No. 6,686,247.

(51) Int. Cl.
*H01L 21/00* (2006.01)
(52) U.S. Cl. .................................................. 438/585
(58) Field of Classification Search ......... 438/585–595
See application file for complete search history.

(56) References Cited

U.S. PATENT DOCUMENTS

| | | | |
|---|---|---|---|
| 4,964,143 A | 10/1990 | Haskell |
| 5,268,330 A | 12/1993 | Givens et al. |
| 5,320,932 A | 6/1994 | Haraguchi et al. |
| 5,348,899 A | 9/1994 | Dennison et al. |
| 5,541,427 A | 7/1996 | Chappell et al. |
| 5,547,900 A | 8/1996 | Lin |
| 5,652,176 A | 7/1997 | Maniar et al. |
| 5,763,312 A | 6/1998 | Jeng et al. |
| 5,930,672 A | 7/1999 | Yamamoto |
| 5,953,613 A | 9/1999 | Gardner et al. |
| 5,976,939 A | 11/1999 | Thompson et al. |
| 6,025,255 A | 2/2000 | Chen et al. |
| 6,033,962 A | 3/2000 | Jeng et al. |
| 6,084,305 A | 7/2000 | Harvey |
| 6,091,129 A | 7/2000 | Cleeves |
| 6,124,191 A | 9/2000 | Bohr |
| 6,194,784 B1 | 2/2001 | Parat et al. |
| 6,251,721 B1 | 6/2001 | Kanazawa et al. |

(Continued)

FOREIGN PATENT DOCUMENTS

EP 0465056 1/1992

(Continued)

OTHER PUBLICATIONS

PCT Imternational Search Report dated Feb. 19, 2004, related to International Application No. PCT/US03/26565.

*Primary Examiner*—Richard A. Booth
(74) *Attorney, Agent, or Firm*—Blakley, Sokoloff, Taylor & Zafman LLP (57) ABSTRACT

The present invention describes methods, apparatus, and systems related to polysilicon gate contact openings over active regions formed by a separate mask to provide enough control of dielectric removal to produce a contact opening at least down to the gate layer but not down to the junction layers. Embodiments include, self-aligned polysilicon contacts done by timed contact etch, by a two layer dielectric, by adding a dielectric etch stop layer, and by partially planarizing a dielectric or etch stop layer over the gate layer. Thus, even if mis-aligned, the gate contact openings will be deep enough to reach active region gates, but not deep enough to reach junctions. As a result, by using a separate mask and by selecting a period of time for etching to active gates, gate contact openings can be formed during manufacture of ICs, semiconductors, MOS memory cells, SRAM, flash memory, and various other memory cells.

6 Claims, 8 Drawing Sheets

U.S. PATENT DOCUMENTS

| | | |
|---|---|---|
| 6,278,189 B1 | 8/2001 | Jeng et al. |
| 6,281,062 B1 | 8/2001 | Sanchez |
| 6,316,349 B1 | 11/2001 | Kim et al. |
| 6,326,270 B1 | 12/2001 | Lee et al. |
| 6,335,279 B1 | 1/2002 | Jung et al. |
| 6,503,818 B1 | 1/2003 | Jang |
| 6,528,413 B1 | 3/2003 | Hashimi |
| 6,576,948 B1 | 6/2003 | Hofmann et al. |
| 6,696,732 B1 | 2/2004 | Matsuoka et al. |

FOREIGN PATENT DOCUMENTS

| | | |
|---|---|---|
| EP | 0601951 | 6/1994 |

SELF-ALIGNED CONTACTS TO GATES

This application is a continuation of Ser. No. 10/226,498 filed on Aug. 22, 2002 U.S. Pat. No. 6,686,247.

BACKGROUND

1. Field

Embodiments of the invention relate to circuit devices and the manufacture of device contacts.

2. Background

Access to and operation of devices (e.g., transistors, resistors, capacitors) on a substrate, such as circuit devices on a semiconductor (e.g., silicon) substrate is provided by contacts to the devices. During manufacture or forming of, for example, Metal Oxide Semiconductor (MOS) transistor semiconductor devices, it is important to assure gate contacts are not electrically short circuited ("shorted") to junction regions (e.g., doped or source/drain region) within an active area. As a consequence, current techniques require placement of gate contacts to be spaced a distance away from active regions to avoid shorting to adjacent source/drains. For example, polysilicon gate contacts for memory cells (e.g., Static Random Access Memory (SRAM) or flash memory) are formed over the field region because gate electrodes are so narrow that a minor contact mask misalignment in the active region may result in shorting the gate contact to a source/drain.

What is needed is a technique for making contact to polysilicon gate layers on top of memory cell active regions, without restriction of proximity to source-drains regions.

DETAILED DESCRIPTION

The manufacture and integration of integrated circuit (IC) gate contacts for semiconductor devices is described. For instance, embodiments provide for forming polysilicon gate layer contacts openings in logic or memory (e.g., Static Random Access Memory (SRAM), flash memory), cell active regions or areas by using a different mask than ones used for junction contacts to form openings at least down to the gate layer, but not down to the junction layer.

In the description prescribed herein, the terms "poly", "polysilicon", and "polycrystalline silicon" are used interchangeably. Also, herein the terms "gate", "gate region", "gate layer", and "gate electrode" are used interchangeably. Similarly, herein the terms "source", "drain", "source/drain", "junction", and "doped region" are used interchangeably. Likewise, herein the terms "source contact", "drain contact", "source/drain contact", "junction contact", and "doped region contact" are used interchangeably. Finally, the terms "active region" and "active area" are used interchangeably herein.

Figure 1:
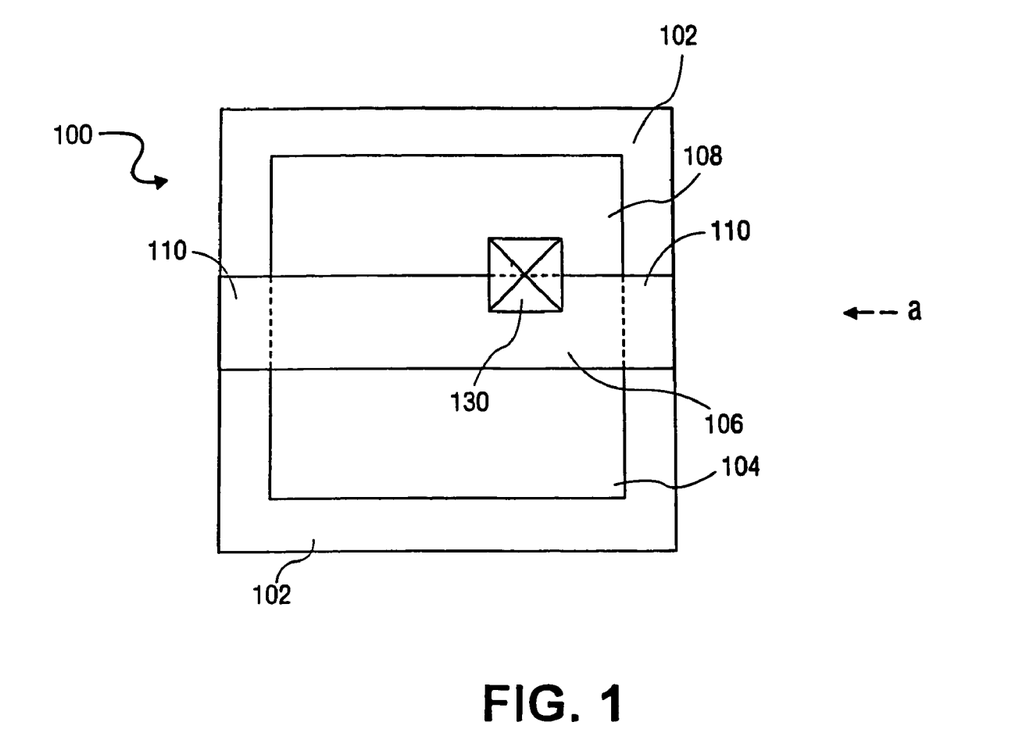
FIG. 1 is a top view of a substrate illustrating a gate contact for a memory cell formed over the active region.

Embodiments contemplate a technique that allows contacts to polysilicon gate layers to be placed within active areas such that mis-aligned contacts will not short to adjacent junction or source/drain regions. For instance, FIG. 1 is a top view of a substrate illustrating a gate contact for a memory cell (e.g. SRAM, flash memory, or other memory cell) formed over the active region. As shown in FIG. 1, memory cell 100 includes surrounding field region 102, junction region (also called "source/drain region" or "doped region") 104, gate regions (106, and 110), and another junction region 108. The gate region or "gate" (e.g. a gate electrode such as polycrystalline silicon) is disposed over the active region at 106, extends into a portion of the field region at 110. The active region (also called the "active area" or "active region") is made up of the central section shown by junction region 104, the central portion of gate region 106, and junction region 108. The field region (also called the "field area" or "non-active region") is made up of surrounding field region 102 and gate regions 110. Typically, the gate region or gate 106 and junction regions 104, 108 are covered or coated with various other layers. For example, gate and junction regions can be covered with silicide, etch stop layers, and/or planarized Interlayer Dielectric (ILD) made of materials including silicon dioxide ($SiO_2$), phosphosilicate glass (PSG, a Phosphorous doped $SiO_2$), silicon nitride ($Si_3N_4$), and silicon carbide (SiC). Thus, an active region gate contact opening 130 can be formed by creating an opening through layers covering or over the gate and extending down to the gate 106 or to a conducting silicide layer that clads gate 106 (e.g., such as is shown by 1307 in FIG. 13). According to embodiments, gate conducting silicide layer materials include titanium silicide ($TiSi_2$), cobalt silicide ($CoSi_2$), and nickel silicide (NiSi). The opening 130 can then be filled with a conductive material, such as a metal to form the contact or connections to the gate 106 (e.g., or conducting layer 1307 shown in FIG. 13).

Furthermore, according to embodiments, it is possible to make a contact opening 130 to the gate 106, so that even if mis-aligned (e.g. mis-aligned towards junction region 108 as shown in FIG. 1) the contact will not short to either junction region 104 or 108. These mis-aligned contact openings and contacts that do not short to junction regions are referred to herein as "self-aligning" contacts. One technique calls for self-aligning contacts formed in two separate or different masking operations: one operation for source/drain or junction contact openings, and a second operation for self-aligning gate contact openings in the active region. The different or separate masking operations used to form junction contact openings can be performed before and/or after the masking operations used to form polysilicon gate contact openings. In addition, the self-aligning gate contact openings may be formed using various techniques and/or systems to provide self-aligned contacts.

For instance, embodiments recognizing that a gate overlies the substrate having the junction regions, and that ILD(s) over the gate are thus thinner than ILD(s) over substrate or junction regions. As a result, it is possible to predict a shorter period of time it will take to etch or remove substrate or ILD to form an opening to the gate as compared to a longer period of time it will take to etch or remove ILD material to form an opening to junction regions. Therefore, an opening deep enough to reach the gate, but not deep enough to hit a junction region or area if mis-aligned can be made by using a separate etch/mask operation to reach the gate in an active region and by selecting a period of time for etching to gate contacts between the shorter and longer period of time. In other words, the gate contacts could be formed directly over a gate within without shorting to adjacent source/drains or junctions. Thus, referring to FIG. 1, the use of a different or separate mask provides enough control of substrate removal or etching to produce a contact opening 130 at least down to the gate layer 106, but not down to the junction layer 104, 108.

Figure 2:
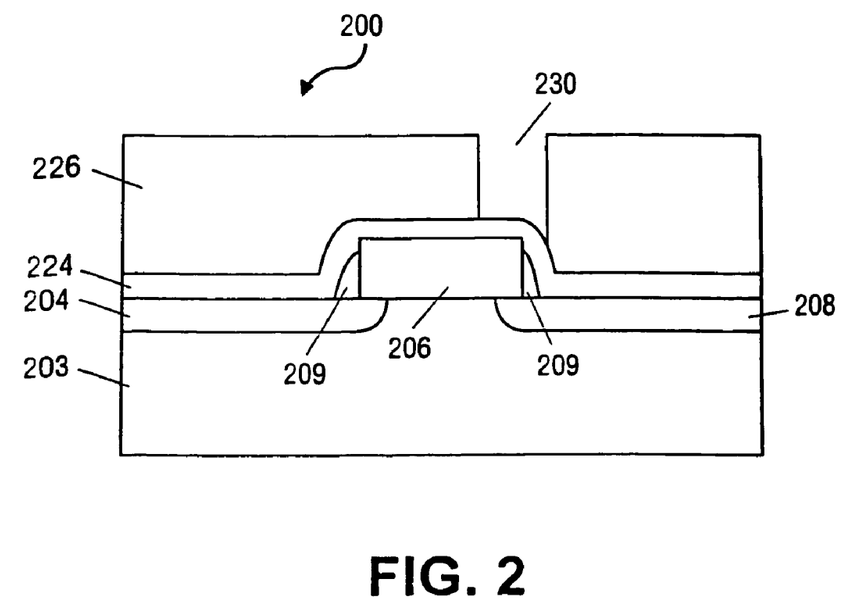
FIG. 2 is a cross-sectional elevation view of a substrate from perspective "a" of FIG. 1, illustrating self-aligned gate contacts using a timed contact etch.

More specifically, for example, a separate mask can be used to form time etched active region gate contact openings during manufacture of ICs, semiconductors, MOS devices where appropriate. FIG. 2 is a cross-sectional elevation view of a substrate from perspective "a" of FIG. 1, illustrating self-aligned gate contacts using a timed contact etch. As shown in FIG. 2, transistor device 200 includes semi-conductor layer 203, which may comprise different materials or layers in accordance with practice of the art. For example, semi-conductor layer 203 could include a lower silicon substrate layer having a well region above it. Semi-conductor larger 203 has formed therein having source/drain or junction region 204, gate 206 (e.g., polysilicon gate), and another source/drain region or junction region 208.

Transistor device 200 also includes conformal etch stop layer 224, which is formed, as shown, on junction region 204 and 208 as well as gate 206. Embodiments with and without dielectric shoulder regions 209 at gate edges; and/or salicide and/or silicide, such as titanium silicide ($TiSi_2$), which may be formed in or on a portion of one or both of gate electrode 206 and junction regions 204, 208 are also contemplated. Etch stop layer 224 can be used to protect gate 206 and junction regions 204, 208. Formed or deposited on etch stop layer 224 is dielectric layer 226 (e.g. planarized Interlayer Dielectric (ILD)). Several materials for the dielectric layer 226 and/or etch stop layer 224 are suitable, such as, $SiO_2$, PSG, $Si_3N_4$, and SiC as well as various other appropriate materials to make the self-aligned feature. FIG. 2 also shows contact opening 230 (e.g., a first or initial contact opening) extending through dielectric layer 226 to the conformal etch stop layer 224. Contact opening 230 is formed, for example, through a lithographic and etch process where a mask over dielectric layer 226 exposes an area for contact opening 230 and contact opening 230 is formed by etching dielectric layer 226 with a chemistry suitable for chemically removing (etching) dielectric layer 226. In one embodiment, dielectric layer 226 and etch stop layer 224 are materials selected such that they may be selectively etched (e.g., an etch chemistry may be selected that etches dielectric layer 226 to the exclusion of, or at a much faster rate then etch stop layer 224).

Figure 3:
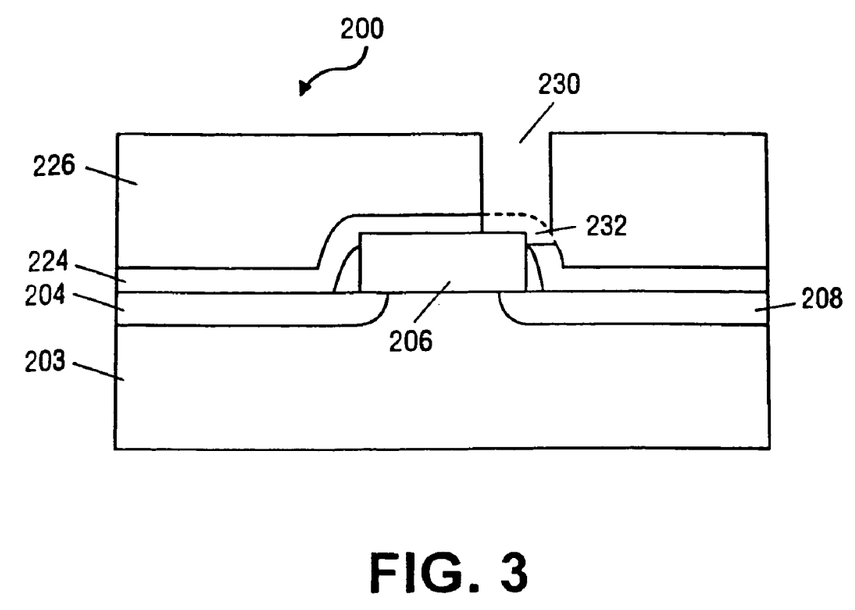
FIG. 3 shows the structure of FIG. 2, after a subsequent opening is formed to extend an initial opening through a conformal etch stop layer to the gate.

FIG. 3 shows the structure of FIG. 2, after a subsequent opening is formed to extend an initial opening through a conformal etch stop layer to the gate. In FIG. 3, subsequent or second opening 232 can be formed extending initial opening 230 through a conformal etch stop layer 224 to the gate 206. Initial opening 230 and subsequent opening 232 can be formed in transistor device active regions or areas (104, 106, and 108) using various techniques and/or systems. For example, initial opening 230 may be formed by etching an opening to the conformal etch stop layer 224 using an etch chemistry having a greater selectivity for the dielectric layer 226 than for the conformal etch stop layer 224 (e.g., an etch chemistry may be selected that etches dielectric layer 226 to the exclusion of, or at a much faster rate then etch stop layer 224). Also, subsequent opening 232 to the gate 206 may be formed by etching for a period of time (e.g. a timed etch) between the time necessary to etch through the conformal etch stop layer 224 on the gate region 206 and a time necessary to etch through etch-stop layer 224 and to the junction region 204, 208.

Accordingly, for example, contact openings 230 could be formed by a timed oxide etch that would reach down through an ILD layer of planarized $SiO_2$ 226 to an $Si_3N_4$ etch stop layer 224 over polysilicon gate layers, but not as far down as source/drain regions 204, 208. A subsequent $Si_3N_4$ timed contact etch for a period long enough to reach down to the top of polysilicon gate regions 206, but not long enough to reach source/drain regions 204, 208, would break through to gate 206, but not through source/drain regions 204, 208.

Embodiments also contemplate transistor device 200 without an etch stop layer on the junction region 204 and 208 and/or the gate 206 (e.g. without 224). Hence, an opening similar to 230 and 232 in FIG. 3 can be formed to gate 206 (without etch stop layer 224) by etching for a period of time between the time necessary to etch through dielectric layer 226 on gate region to gate 206 and a time necessary to etch through the dielectric layer 226 to junction region 204, 208.

Figure 4:
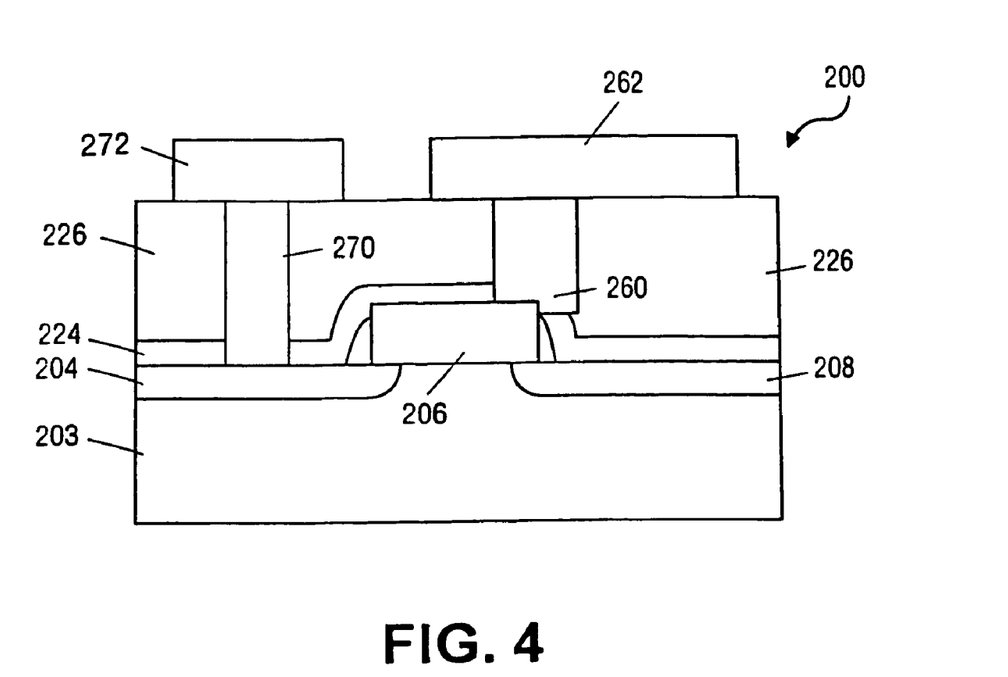
FIG. 4 shows the structure of FIG. 3, after forming a gate plug and a gate contact.
Figure 13:
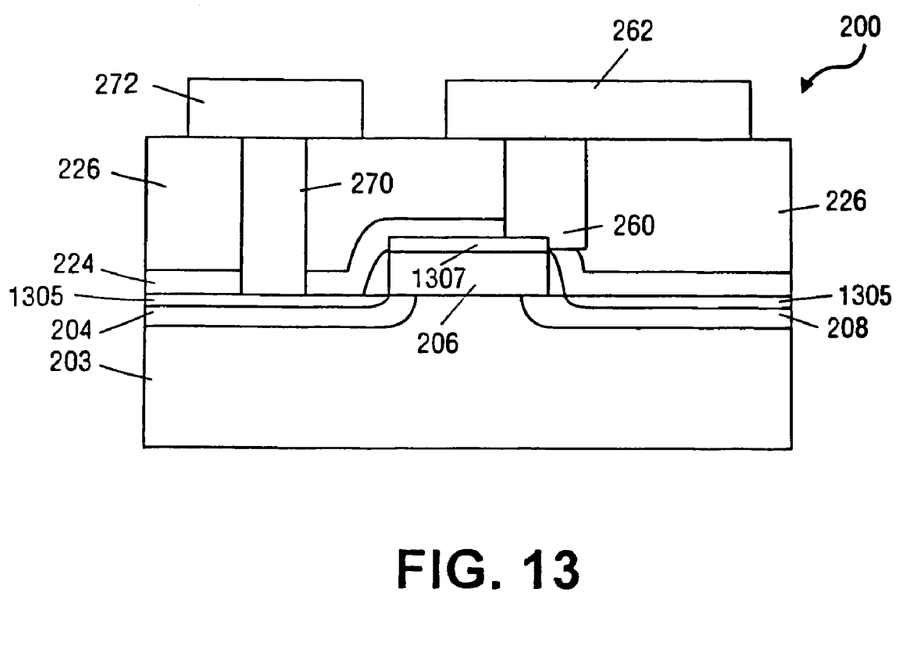
FIG. 13 shows the structure of FIG. 3, after forming a gate plug and a gate contact to a conducting silicide layer.

FIG. 4 shows the structure of FIG. 3, after forming a gate plug and a gate contact. Likewise, FIG. 13 shows the structure of FIG. 3, after forming a gate plug and a gate contact to a conducting silicide layer that clads the gate. As illustrated in FIG. 4, the resulting gate contact opening can be filled with a conductive material, such as metal or other appropriate material, and planarized to form gate plug 260. As explained above with respect to gate contact opening 130 of FIG. 1, a gate contact opening can be formed down to the gate (e.g., such as is shown by 206 in FIG. 4) or to a conducting silicide layer that clads the gate (e.g., such as is shown by 1307 in FIG. 13). Gate plug 260 can in turn be covered with the same or a different conductor, metal, or other appropriate material to act as a gate contact 262.

Also, the separately formed source/drain contact opening can then be filled with a conductive material (e.g. the same or a different material than that used for gate contact 260), and planarized to form a source/drain plug 270. As with the gate contact opening 130 described above, source/drain contact openings can be formed down to the source/drain 204/208 or to a conducting silicide layer that clads the source/drain (e.g., such as is shown by 1305 in FIG. 13).

According to embodiments, source/drain conducting silicide layer materials include $TiSi_2$, $Co\ Si_2$, and NiSi. Also, as with the gate contacts described with respect to 106 above, source/drain contacts can be formed to contact or connect to the source/drain 204/208 or to contact or connect to a conducting silicide layer that clads the source/drain (e.g., such as is shown by 1305 in FIG. 13). Thus, plug 270 can form a contact to the source/drain 204/208 as shown in FIG. 4, or to a conducting silicide layer that clads the source/drain as shown by 1305 in FIG. 13. Source/drain plug 270 can then be covered with the same or a different conductor or metal to form a source/drain contact 272. Also, considered by the invention are depositing conducting material in gate and/or source/drain openings simultaneously or separately in any order; as well as forming gate and/or source/drain contacts simultaneously or separately in any order.

Moreover, the techniques described contemplate various metallization techniques including, for example, (depositing Tungsten (W) and planarizing to form plugs, then depositing Aluminum (Al) to form contact; and/or a Damascene process such as a larger etch to form a larger more shallow opening around a smaller deeper initial contact opening, then both are filled with Copper (Cu) and planarized) to form gate and/or source/drain plugs and contacts.

Figure 5:
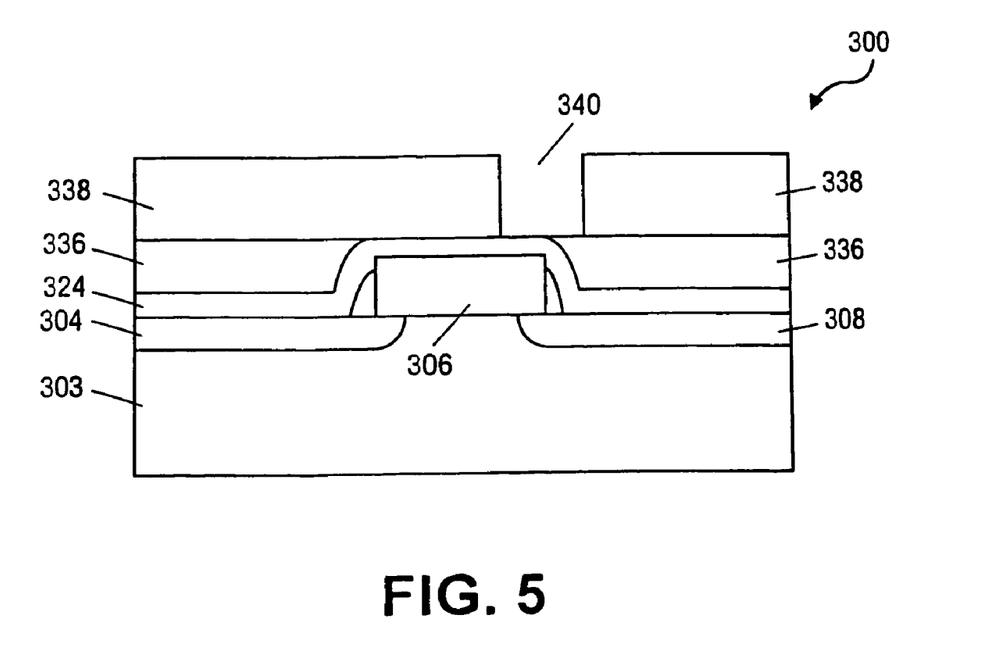
FIG. 5 is a cross-sectional elevation view of a substrate illustrating self-aligned gate contacts using a two layer dielectric.

According to other embodiments, a separate mask can be used to form two layer dielectric active region gate contact openings during manufacture of ICs, semiconductors, memory cells, and various other devices where appropriate. FIG. 5 is a cross-sectional elevation view of a substrate illustrating self-aligned gate contacts using a two layer dielectric. As shown in FIG. 5, transistor device 300 is made up of, in this example, semi-conductor layer 303 having junction region 304 as well as junction region 308. Gate 306 and conformal etch stop layer 324 of on the order of 0.05 micron thickness are also present. Formed, on etch stop layer 324, as shown in FIG. 5, embodiments contemplate two dielectric layers 336, 338 made with two types of dielectric with different etch rates (such as two metal-polysilicon ILDs). First dielectric layer 336 can be formed to have a planar surface with portions of etch stop layer 324. For example, the first dielectric layer 336 could be initially deposited or formed as a conformal dielectric layer (e.g. see 524 and 525 of FIG. 10) on a transistor device 300 in the active region (see 104, 106 and 108 of FIG. 1) as well as other regions as necessary. After initially being deposited or formed, conformal first dielectric layer could then be planarized (e.g., by mechanical or chemical-mechanical polishing) to expose conformal etch stop layer 324. After first dielectric layer 336 is planarized, a different second dielectric layer 338 is formed on the transistor device.

As shown in FIG. 5, first gate contact opening 340 is formed through second dielectric layer 338 to first dielectric layer 336. Initial opening 340 can be formed in the active region using various techniques and/or systems. For example, first gate contact opening 340 may be formed by etching the opening to the first dielectric layer using an etch chemistry having a greater selectivity for second dielectric layer 338 than for first dielectric layer 336 and etch stop layer 342.

Several materials are suitable for the first dielectric layer 336, different second dielectric layer 338, and etch stop layer 324, such as, $SiO_2$, PSG, $Si_3N_4$, and SiC as well as various other appropriate dielectrics that can provide the contact etch selectivity (e.g. various etch rates) for making the self-aligned feature. For example, second dielectric layer 338 comprising $SiO_2$, and first dielectric layer 336 comprising $Si_3N_4$ or SiC would provide high etch selectivity and minimize mis-aligned polysilicon contacts from shorting to adjacent source/drain regions. Similarly, second/top dielectric layer 338 could comprise phosphosilicate glass (PSG, a Phosphorous doped $SiO_2$), while first/bottom dielectric layer 336 comprises an undoped $SiO_2$.

Figure 6:
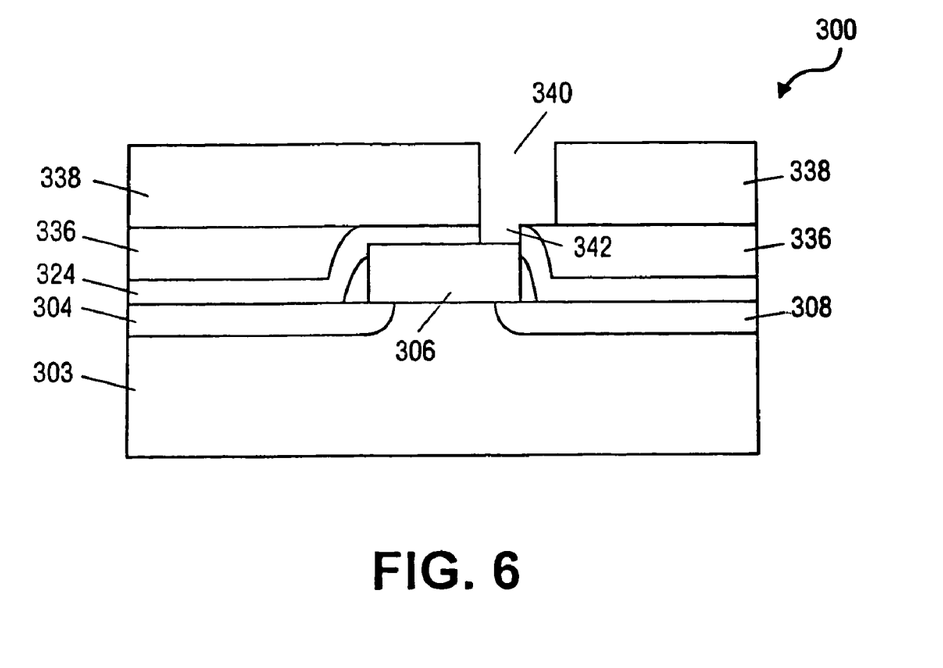
FIG. 6 shows the structure of FIG. 5, after a second gate contact opening is formed to extend the gate contact opening to the gate.

FIG. 6 shows the structure of FIG. 5, after a second gate contact opening is formed to extend the gate contact opening to the gate. As shown in FIG. 6, after first contact opening 340 is formed, second gate contact opening 342 can be formed to extend the gate contact opening to gate 306. Subsequent gate contact opening 342 can be formed in the active region using various techniques and/or systems. For example, gate contact opening 342 can be formed by etching an opening through conformal etch stop layer 324 to the gate 306.

Thus, second gate contact opening 342 can be formed by etching for a period of time (timed etch) between a time necessary to etch through conformal etch stop layer 324 on the gate region (e.g. and to gate 306) and a time necessary to etch through first dielectric layer 336 and/or etch stop layer 324 and to junction region 304, 308. As described above and illustrated in FIG. 4, the resulting gate contact opening (e.g. 340 and 342) can then be used to form gate plugs and/or contacts simultaneously or separately, in any order, comparative to forming source/drain plugs and/or contacts.

Figure 7:
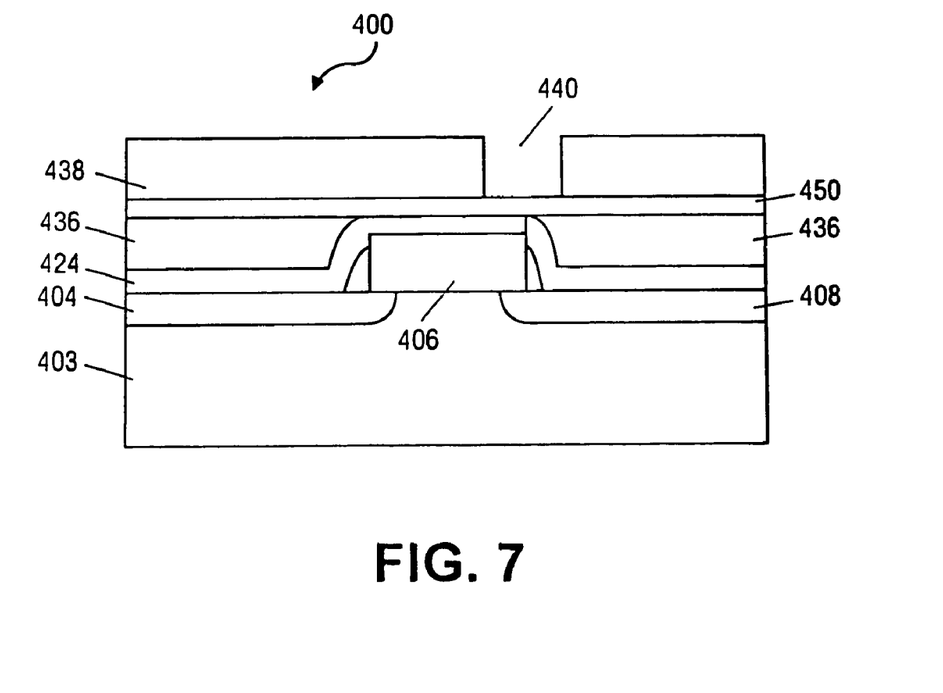
FIG. 7 is a cross-sectional elevation view of a substrate illustrating self-aligned gate contacts formed by adding a dielectric etch stop layer.

Further, according to other embodiments, a separate mask can be used to form dielectric etch stop layer active region gate contact openings during manufacture of ICs, semiconductors, memory cells, and various other devices where appropriate. FIG. 7 is a cross-sectional elevation view of a substrate illustrating self-aligned gate contacts formed by adding a dielectric etch stop layer. As shown in FIG. 7, transistor device 400 is made up of semiconductor layer 403 having junction region 404 as well as junction region 408. Gate 406 and conformal etch stop layer 424 are also present. Formed on etch stop layer 424 is first dielectric layer 436, such as a metal-polysilicon inter-level dielectric (ILD). Likewise, as shown in FIG. 7, embodiments contemplate second etch stop layer 450 formed on the dielectric layer 436, as well as on a portion of etch stop layer 424 over or on gate layer 406. Second etch stop layer 450, may be a thin layer (e.g., 0.05 micron thickness), a planar layer, and/or may be formed after over etching first dielectric layer 436 with respect to conformal etch stop layer 424. On the etch stop layer 450, embodiments contemplate second dielectric layer 438, such as a metal-polysilicon inter-level dielectric (ILD), which may be the same or different material than the first dielectric layer 436.

To form first dielectric layer 436, a dielectric is initially deposited as a conformal dielectric layer (e.g. see 524 and 525 of FIG. 10) on etch stop layer 424 on the active area of the device. After initially being deposited or formed, conformal first dielectric layer 436 is then planarized or over etched to expose conformal etch stop layer 424. After first dielectric layer 436 is planarized or over etched, second etch stop layer 450 is formed on and in contact with the planarized first dielectric layer 436 and with portions of conformal etch stop layer 424 on gate 406. Second etch stop layer 450 may then be planarized. Embodiments contemplate second dielectric layer 438, formed on second etch stop layer 450 on the active area of the device. Although second dielectric layer 438 may be the same or different material than the first dielectric layer 436, it is a different material than second etch stop layer 450. Also, second etch stop layer 450 may be the same or a different material than conformal etch stop layer 424.

Several materials may be used for first etch stop layer 424, first dielectric layer 436, second etch stop layer 450, and/or second dielectric layer 438, such as, $SiO_2$, PSG, $Si_3N_4$, and SiC as well as various other appropriate dielectrics that can provide the contact etch selectivity to make the self-aligned feature. For example, both first (bottom) layer 436 and second (top) dielectric layer 438 could both comprise metal-polysilicon ILD such as SiC or $SiO_2$, while conformal dielectric etch stop layer 424 and second (planar) dielectric etch stop layer 450 (deposited between the ILD layers) both comprise $Si_3N_4$. Also, a thin etch stop layer 450, such as $Si_3N_4$ or SiC could be deposited between top 238 and bottom 436 ILD layers made up of $SiO_2$ to minimize mis-aligned gate contacts from etching down to source/drain regions and creating shorts.

Figure 8:
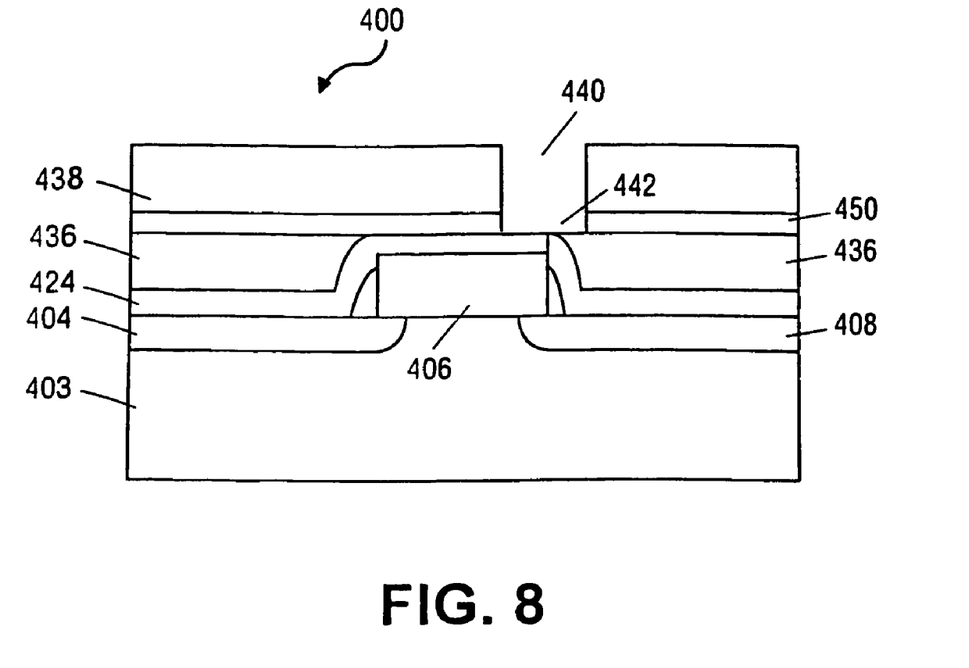
FIG. 8 shows the structure of FIG. 7, after a subsequent gate contact opening is formed through the second etch stop layer to the conformal etch stop layer.
Figure 9:
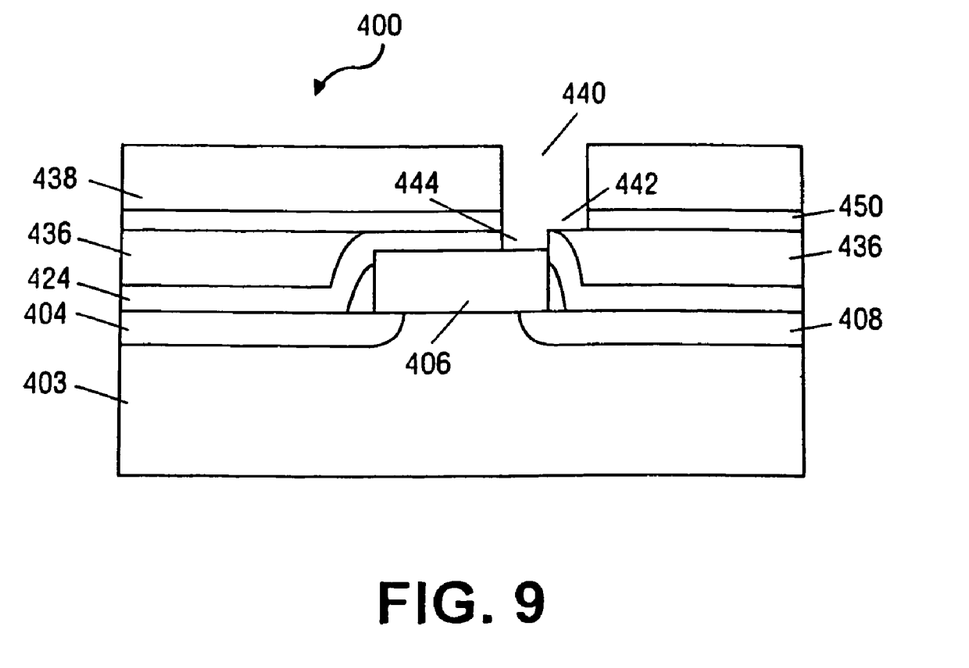
FIG. 9 shows the structure of FIG. 8, after a third gate contact opening is formed to extend the gate contact opening to the gate.

According to embodiments, initial and subsequent openings can be formed to gate 406 in the active region using various techniques and/or systems. For example, as shown in FIG. 7, first or initial gate contact opening 440 can be formed through the second dielectric layer 438 to second etch stop layer 450. Here, first gate contact opening 440 may be formed by etching the opening to second etch stop layer 450 using for example, an etch chemistry having a greater selectivity for the second dielectric layer 438 than for the second etch stop layer 450. FIG. 8 shows the structure of FIG. 7, after a subsequent gate contact opening is formed through the second etch stop layer to the conformal etch stop layer. FIG. 8 shows second or subsequent gate contact opening 442 that can be formed through second etch stop layer 450 to etch stop layer 424. For example, subsequent gate contact opening 442 may be formed by etching the opening to etch stop layer 424 using an etch chemistry having a greater selectivity for second etch stop layer 450 than for etch stop layer 424 and than for first dielectric layer 426. FIG. 9 shows the structure of FIG. 8, after a third gate contact opening is formed to extend the gate contact opening to gate. As shown in FIG. 9, third gate contact opening 444 can be formed to extend the gate contact opening to gate 406. For instance, third gate contact opening 444 can be formed by etching for a period of time between a time necessary to etch through the conformal etch stop layer 424 on the gate region and a time necessary to etch through the first dielectric layer 436 and/or conformal etch stop layer 424 and to junction region 404, 408.

Moreover, embodiments contemplate second contact opening 442 and third contact opening 444 formed during the same etch to extend the gate contact opening to gate 406. For instance, etching to form an opening through second etch stop layer 450 and through etch stop layer 424, to gate 406 can be done using an etch chemistry having a greater selectivity for the second etch stop layer 450 and for etch stop layer 424 than for the first dielectric layer (e.g. second etch stop layer 450 and first etch stop layer 424 are both the same material, such as, $Si_3N_4$). In this instance, second gate contact opening 442 and third gate contact opening 444 can be formed by etching for a period of time between a time necessary to etch through etch stop layer 450 and through etch stop layer 424 on the gate region, and a time necessary to etch through second etch stop layer 450 and through first dielectric layer 436 and/or etch stop layer 424 and to junction region 404, 408. As described above and illustrated, for example, in FIG. 4, the resulting gate contact opening (e.g. 440, 442, and 444) can then be used to form gate plugs and/or contacts simultaneously or separately, in any order, comparative to forming source/drain plugs and/or contacts.

Figure 10:
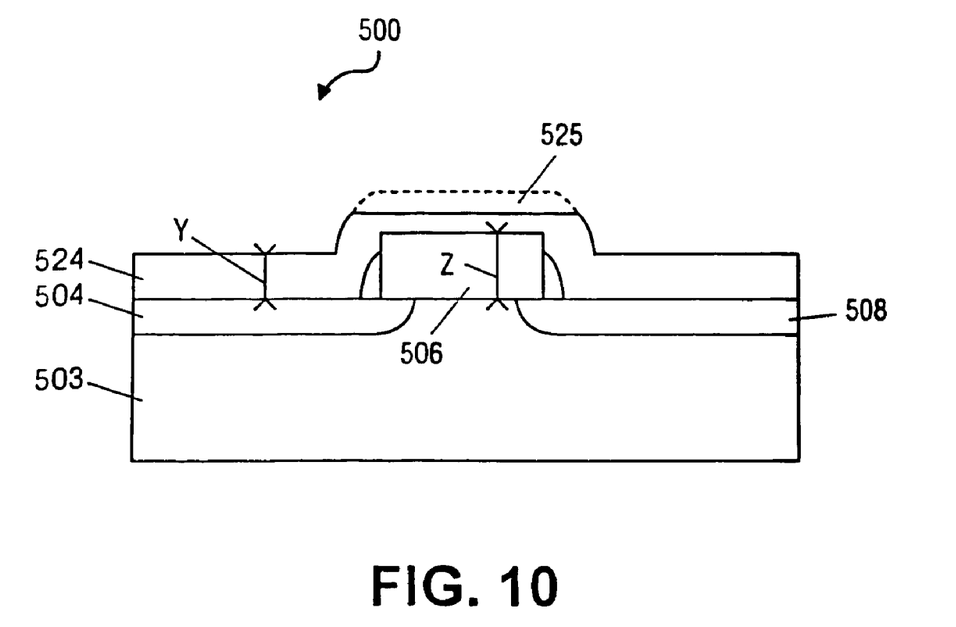
FIG. 10 is a cross-sectional elevation view of a substrate illustrating self-aligned gate contacts formed by partially planarizing a dielectric or etch stop layer over the gate layer.

Furthermore, according to additional embodiments, a separate mask can be used to form partially planarized dielectric active region gate contact openings during manufacture of ICs, semiconductors, memory cells, and various other active devices where appropriate. FIG. 10 is a cross-sectional elevation view of a substrate illustrating self-aligned gate contacts formed by partially planarizing a dielectric or etch stop layer over the gate layer. As shown in FIG. 10, transistor device 500 is made up of semi-conductor layer 503 having junction regions 504 and 508. Gate 506 is also present. On the gate and junction regions, embodiments include a thick (e.g., on the order of 0.1 microns) conformal first dielectric (e.g. an ILD dielectric or etch stop layer) 524 that has been partially planarized or etched 525 on a portion of gate 506. Partially planarized dielectric layer 524 is formed in the active region using various techniques and/or systems. For example, dielectric layer 524 could be initially deposited or formed as a thick conformal dielectric layer (e.g. 524 and 525) in the active region (104, 106 and 108) as well as other regions of a transistor device 500. The thick conformal dielectric layer (e.g. 524 and 525) includes a height on a portion of the junction region, height "Y", which is less than the height of the gate, height "Z". After initially being formed, dielectric layer 524 could then be partially planarized or etched (e.g. removing portion 525) to create the conformal etch stop layer.

Figure 11:
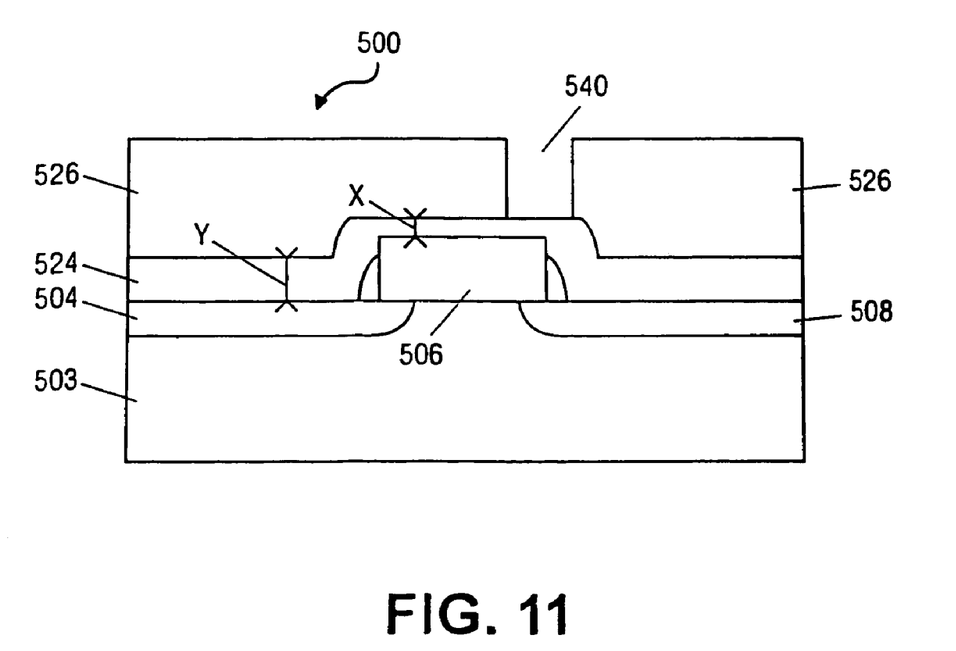
FIG. 11 shows the structure of FIG. 10, after forming a different second dielectric layer over the partially planarized dielectric layer, and forming a first gate contact opening through the different second dielectric layer to the partially planarized dielectric layer.

FIG. 11 shows the structure of FIG. 10, after forming a different second dielectric layer over the partially planarized dielectric layer, and forming a first gate contact opening through the different second dielectric layer to the partially planarized dielectric layer. As shown in FIG. 11, embodiments include partially planarized dielectric layer 524 including a different second height on a portion of the gate, height "X" (e.g., on the order of 0.03 microns), which is less than the height on a portion of the junction region, height "Y" (e.g., on the order of 0.1 microns). After first dielectric layer 524 is partially planarized, different second dielectric layer 526 is formed over the cell active area on the transistor device. Also, shown in FIG. 11, first gate contact opening 540 is formed through second dielectric layer 526 to first dielectric layer 524. Initial opening 540 is formed in the active area using various techniques and/or systems. For example, first gate contact opening 540 may be formed by etching the opening to the first dielectric layer using an etched chemistry having a greater selectivity for the different second dielectric layer 526 than for the first dielectric layer 524.

Figure 12:
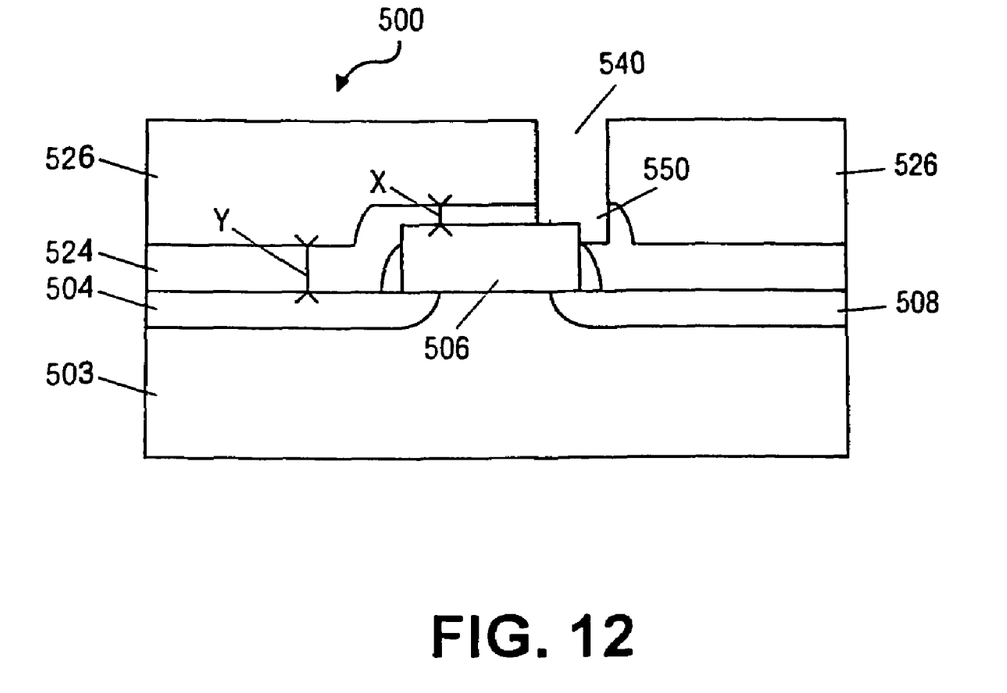
FIG. 12 shows the structure of FIG. 11, after forming a second gate contact opening to extend the gate contact opening to the gate.

FIG. 12 shows the structure of FIG. 11, after forming a second gate contact opening to extend the gate contact opening to the gate. As shown in FIG. 12, after first contacting opening 540 is formed, second gate contact opening 550 is formed to extend the gate contact opening to gate 506. Subsequent opening 550 can be formed in the active region using various techniques and/or systems. For example, second gate contact opening 550 can be formed by etching to form an opening through the partially planarized dielectric layer 524 to the gate 506. Moreover, in order form second gate contact opening 542 it is possible to etch for a period of time (timed etch) between a time necessary to etch through the different second height on the gate, height "X", and a time necessary to etch through the first height, height "Y", to the junction region. In addition, using partially removed dielectric or etch stop 524 such that height "X" is much or substantially less (e.g. by a factor of 10) than height "Y" may increase the effectiveness.

Several materials are suitable for the first dielectric or etch stop layer 524, and/or different second dielectric layer 526, such as, $SiO_2$, PSG, $Si_3N_4$, and SiC as well as various other appropriate dielectrics that can provide the contact etch selectivity for making the self-aligned feature. For example, second dielectric layer 526 comprising $SiO_2$, and partially planarized first dielectric layer 524 comprising $Si_3N_4$ or SiC would provide high etch selectivity and prevent mis-aligned polysilicon contacts from shorting to adjacent source/drain regions. Similarly, second/top dielectric layer 526 of PSG, and partially planarized dielectric layer 524 of an undoped $SiO_2$ could be used. Moreover, embodiments also contemplate having a normal conformal etch stop layer over gate and junction region, such as 424, with a conformal partially planarized region 524 formed on the normal etch stop 424, and made of a different dielectric material than the normal etch stop 424. As described above and illustrated in FIG. 4, the resulting gate contact opening (e.g. 540 and 550) can then be used to form gate plugs and/or contacts simultaneously or separately, in any order, comparative to forming source/drain plugs and/or contacts.

According to the techniques and/or systems described above, gate contacts may be formed over an active area (e.g., a cell area) of a gated device (such as a transistor). One advantage to forming gate contacts within an active area is that contacts to gate layers can be made without spacing restrictions to active areas. Thus, for instance, polysilicon contacts can be drawn over active gate regions leading to smaller semiconductor circuit layouts, such as SRAM memory cells. As a result, cells can be drawn smaller and/or the "metal 1" dimensions in the cell can be relaxed during manufacture of ICs, semiconductors, MOS memory cells, SRAM, flash memory, and various other memory cells where contacts openings can be provided as described herein.

Thus, polysilicon gate contact openings over active regions by use of a different or separate mask to provide enough control of substrate removal or etching to produce a contact opening at least down to the gate layer but not down to the junction layer has been described.

While the various embodiments of the invention have been described, those skilled in the art will recognize that the potential embodiments of the invention are not limited to those embodiments described, but can be practiced with modification and alteration within the spirit and scope of the appended claims. The description is thus to be regarded as illustrative instead of limiting.

What is claimed is:

1. A method for forming a contact comprising:

in an active region, forming a gated device having a gate in a gate region, a junction region, and a dielectric layer over the gate, the gate region and the junction region within the active region, the dielectric having a first thickness over the gate and a different second thickness over the junction region; and forming a contact opening through the dielectric layer to the gate comprising etching for a period of time between a time necessary to etch through the dielectric layer on the gate region and a time necessary to etch through the dielectric layer and to the junction region;

forming a contact in the contact opening to the gate.

2. The method of claim 1, wherein prior to forming the contact to the gate, the method further comprises:

forming a contact opening through the dielectric layer to a junction region of the gated device using a first mask; and forming a contact opening through the dielectric layer to the gate of the gated device using a different second mask.

3. The method of claim 1, wherein prior to forming the dielectric layer on the gated device, forming a conformal etch stop layer on the junction region and the gate of the gated device.

4. The method of claim 3, wherein the forming an opening through the dielectric layer to the gate further comprises:

forming an initial opening through the dielectric layer to the conformal etch stop layer;

forming a subsequent opening through the conformal etch stop layer to the gate; and wherein forming the subsequent opening comprises etching for a period of time between a time necessary to etch through the conformal etch stop layer on the gate region and a time necessary to etch through the conformal etch stop layer and to the junction region.

5. The method of claim 3, wherein the forming a dielectric layer on the gated device further comprises:

forming a conformal first dielectric layer on the gated device in the active region;

planarizing the first conformal dielectric layer to expose the conformal etch stop layer on a portion of the gate;

forming a different second dielectric layer on the gated device in the active region; and wherein the forming a contact opening through the dielectric layer and to the gate further comprises:

etching an initial gate contact opening to the different second dielectric layer using an etch chemistry having a greater selectivity for the second dielectric layer than for the first dielectric layer and etch stop layer; and etching a subsequent gate contact opening through the etch stop layer to the gate.

6. The method of claim 5, wherein the etching a subsequent gate contact opening comprises etching for a period of time between a time necessary to etch through the etch stop layer on the gate region and a time necessary to etch through the etch stop layer and to the junction region.

* * * * *